Figure 1:
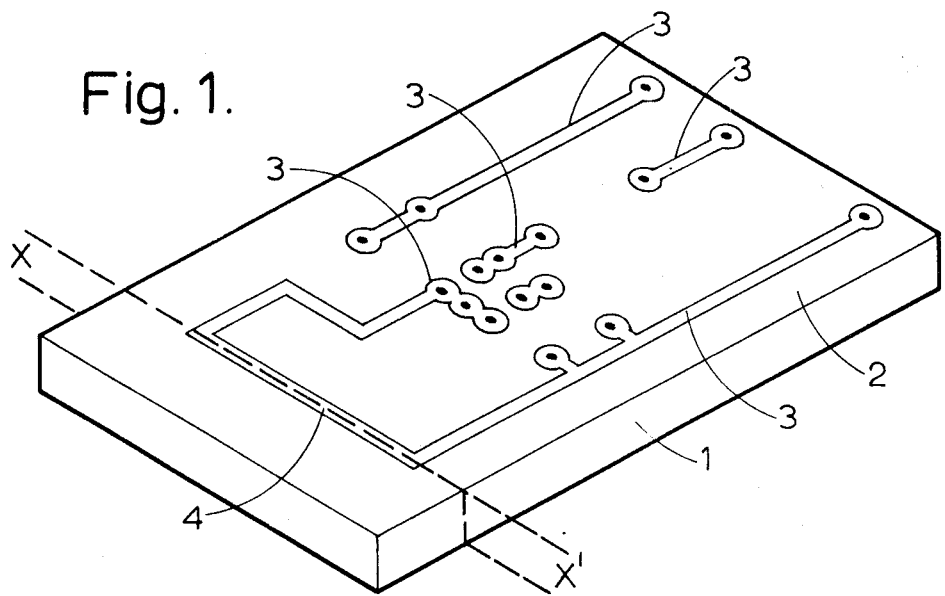

United States Patent [19]

Fanshawe

[11] 4,079,284

[45] Mar. 14, 1978

[54] MOUNTING PIEZOELECTRIC ELEMENTS

[75] Inventor: David G. J. Fanshawe, Selsdon, England

[73] Assignee: U.S. Philips Corporation, New York, N.Y.

[21] Appl. No.: 682,276

[22] Filed: May 3, 1976

[51] Int. Cl.² .............................................. H01L 41/04
[52] U.S. Cl. ...................................... 310/348; 29/626; 361/401
[58] Field of Search .................. 29/626, 25.35, 630 D, 29/203 B; 310/9.1, 9.2, 348; 361/400, 401, 405

[56]  References Cited

U.S. PATENT DOCUMENTS

| | | | |
|---|---|---|---|
| 2,990,498 | 6/1961 | Evans | 29/626 X |
| 3,049,647 | 8/1962 | Lincoln | 361/401 |
| 3,059,152 | 10/1962 | Khouri | 361/405 X |
| 3,209,178 | 9/1965 | Koneval | 310/9.1 |
| 3,213,404 | 10/1965 | Hedstrom | 29/626 UX |
| 3,460,234 | 8/1969 | Iantorno | 29/626 X |
| 3,544,950 | 12/1970 | Lopez et al. | 361/401 X |
| 3,949,247 | 4/1976 | Fenner et al. | 310/8.6 |

Primary Examiner—Victor A. DiPalma
Attorney, Agent, or Firm—Frank R. Trifari; Bernard Franzblau

[57] ABSTRACT

A method of mounting an elongate piezoelectric element on a laminated printed wiring board by forcing said element into the board at an angle normal to the surface of the board and at a point where the element can contact a conductor line on the board. Piezoelectric elements made of ferroelectric ceramic materials are suitable especially when mounted on a printed circuit board composed of copper-clad phenol formaldehyde laminated plastic.

15 Claims, 5 Drawing Figures

MOUNTING PIEZOELECTRIC ELEMENTS

This invention relates to an improved method of mounting piezoelectic elements.

In particular, this invention relates to a method of mounting piezoelectric elements on a printed wiring board to provide both strong mechanical connections and good electrical contacts.

Piezoelectric elements may take the form of crystals, pieces of crystals or ceramic materials which exhibit an anisotropic effect and generate piezoelectricity when subject to mechanical stress. Piezoelectric elements are widely used throughout industry, e.g. as transducers for sound and ultra sound in air, pick-ups and sensors e.g. for record players, resonators, filters, delay lines in colour television, in keyboards of teleprinters etc, generators and various other miscellaneous uses including flow meters, flaw meters, and small motors. The elements are frequently elongated and cylindrical in shape and they undergo a dimensional change when placed under the influence of an electric field or, when subject to an external force which produces a compression or a strain in the material, they generate an electric charge. Piezoelectric elements need to be firmly fixed in position in use with an associated electronic circuit so that a good electrical contact is made while remaining compliant to the mechanical stresses placed upon it or to the influence of electric fields. To facilitate good electrical connections piezoelectric elements generally are coated on their external surfaces with a metal, such as silver and the element is bonded via the metal coating to the electronic circuit.

Various methods of bonding piezoelectric elements to electronic circuits are known prior to the present invention but none have proved to be completely satisfactory. Thus, one method is to mechanically clamp each element in position, for example, by the use of metal spring clips or other mechanical devices, but machanically clamping the element in position frequently results in overstressing the piezoelectric element with a consequential loss in efficiency particularly when a long term good electrical contact is to be made and may even result in breakage.

In another method the piezoelectric elements are adhesively bonded to an electronic circuit with an electrically conductive, mechanically strong adhesive. It is necessary in this case to thoroughly clean the piezoelectric elements with a degreasing agent, such as, trichloroethylene to remove surface dirt and grease prior to the application of the adhesive. The element when generally is clamped in position and held at an elevated temperature for a period of usually some hours until the adhesive is set. A setting time for an adhesive commonly used, such as an electrically conductive epoxy resin, is 3 hours at 60° C. Apart from the inconvenience of carrying out this method the method has the disadvantage in that the adhesive bond formed may be temperature dependent in use, for example, a mechanical damping effect may occur on the piezoelectric element when it is under stress at elevated temperatures. The temperature limit for an adhesively bonded joint may be not more than 50° C.

In a further known method to obtain good mechanical joints and good electrical contacts, piezoelectric elements are soldered into position. This method is frequently subject to the disadvantage that the soldering process may remove some of the metal coating on the external surface of the piezoelectric element, e.g. by dissolving the silver. The soldering process is also inconvenient and may result in the piezoelectric element being overheated at the soldering temperature thereby losing some or all of its piezoelectric properties. Furthermore, any flux remnants and excess solder on the joints have to be removed after the soldering process is completed.

It is known that piezoelectric elements are both brittle and crystalline, particularly ceramic piezoelectric elements. However, they are also hard and are capable of withstanding and transmitting relatively large physical forces. Piezoelectric elements for example, are particularly resistant to compressive forces when applied to the main axis of the element but are not resistant to the same extent to tensile forces and/or to bending forces. We have discovered, surprisingly, that a piezoelectric element can withstand a high compressive force sufficient to enable the element to penetrate a printed wiring board without damaging the element or the printed wiring board and any associated electronic circuits. A strong mechanical joint and a good electrical connection with a conductor line of the electronic circuit can be made in one operation.

One object of the present invention is to provide a piezoelectric element containing device in which the piezoelectric element has been staked or pinned through a wiring circuit on a substantially flat insulative substrate.

According to the present invention there is provided a method of mounting a piezoelectric element on a printed wiring board to produce a strong mechanical joint and a good electrical contact which comprises applying a force to one end of the element when the element is held at an angle substantially normal to the surface of the board so that the other end of the element penetrates into the board at a point on or adjacent to a conductor line of the printed wiring board. Preferably the printed wiring board is a printed circuit on a laminated plastics board. The printed wiring board may be provided with one or more holes through the printed circuit board on or adjacent to the conductor lines into which holes piezoelectric elements of slightly larger cross-sectional area than the appropriate hole are forced so as to make contact with at least one conductor line. If desired the holes through the printed wiring board may pass through the substrate material only so that the metal, e.g. copper of the conductor line is bent over to make an additional electrical contact with the piezoelectric element. The piezoelectric element may be force fitted into a hole when a hole is present, or into the board, adjacent to two conductor lines to make contact with both lines. A particularly good electrical contact is made when a parallel sided element is forced through the board from the conductor line side on or adjacent to the conductor line of a malleable metal so that part of the conductor line is drawn into the hole made during insertion. No soldering or other fastening means is necessary.

Preferably, the piezoelectric element is force inserted through the printed wiring board to a depth so that the end just protrudes from the other side of the board. One end of the piezoelectric element may then be left free so that it is mounted in a cantilever manner to stresses applied during use. A piezoelectric element with parallel sides along its length may also be mounted by being force inserted through a printed wiring board from the conductor line side to almost the whole of its length to form the cantilever type mounting. Alternatively, the other end of the element may be similarly fixed to another printed wiring board to leave the centre of the element available to take up flexural stresses during use. Preferably, the force required to rupture the printed wiring board on or adjacent to at least one conductor line of the printed wiring board is less than 600 MN per meter squared.

The force required to rupture a printed wiring board over a specific area may be reduced by the provision of a hole which is smaller than the cross-sectional area of the piezoelectric element. The holes may be drilled or punched or otherwise made at the point of penetration of each element providing that the piezoelectric element when in position is contiguous with the conductor line of the printed wiring board.

The printed wiring board may be formed from any suitable electrically insulative substrate with a wiring circuit on one surface. A particularly suitable printed wiring board may be formed from a metal, e.g. copper clad phenol formaldehyde paper impregnated laminate. Other substrates which are suitable include glass-fibre resin impregnated laminates which may be coated on one or both sides with a conductive metal layer forming the conductor line or lines. Suitable resins for impregnating the substrate materials when in the form of a laminate material are natural or synthetic resins such as phenol-formaldehyde resins, urea-formaldehyde resins and epoxy resins, provided that the resultant resin when cured or polymerised is a suitable insulator and has an adequate mechanical strength to clamp the piezoelectric element, when in use, permanently in position.

In one preferred embodiment the piezoelectric element is mounted clamped at one end by the copper clad plastics laminate to form a cantilever type mounting. In another embodiment, the piezoelectric element is mounted clamped at each end between two laminates by the method according to the invention. Piezoelectric elements which are particularly suitable for use according to the invention are ferro electric ceramic materials of a bilaminar construction with their polarity orthogonal to the main axis of each element.

Such elements, termed "bimorphs" or "multimorphs" are commonly used in ceramic record player cartridges.

Figure 2:
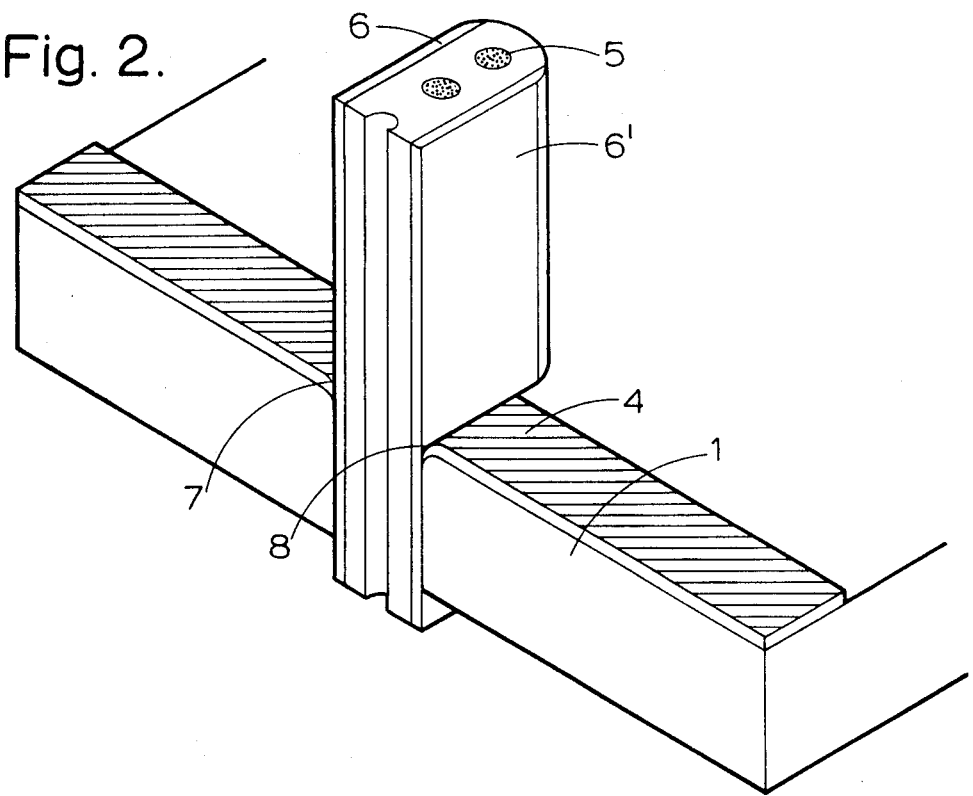
Figure 3:
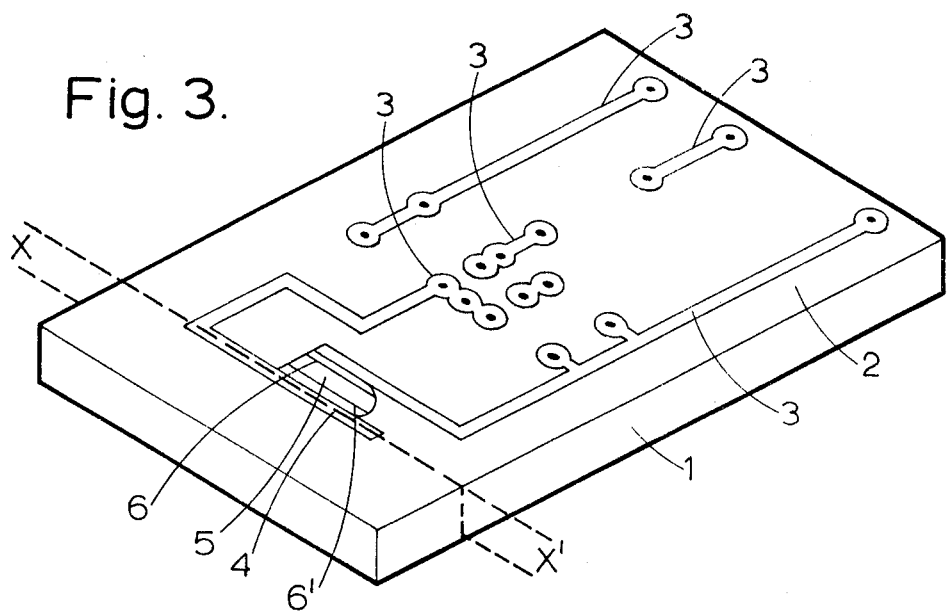
Figure 4:
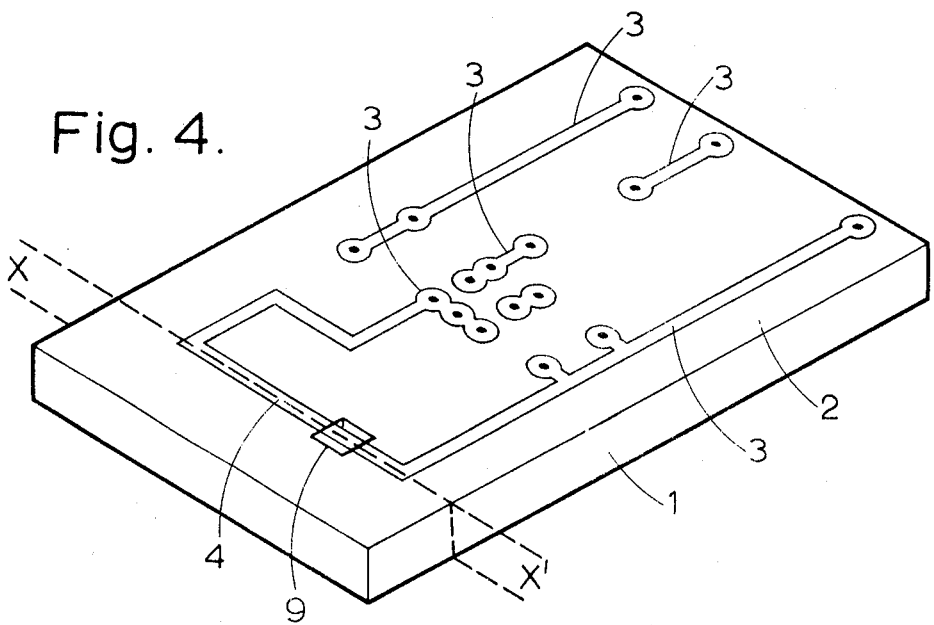
Figure 5:
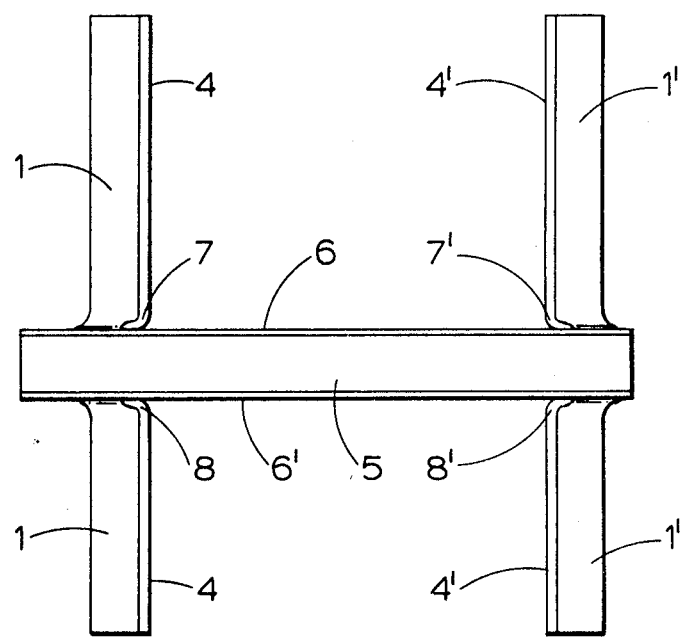

In order that the invention may be readily carried into effect, it will now be described in more detail, by way of example, with reference to the accompanying drawings, in which:

FIG. 1 is an elevational view of a printed wiring board with an electrically conductive track on one surface and which is suitable for receiving one or more piezoelectric elements according to the invention, FIG. 2 is a perspective view of a section of FIG. 1 along the line X X', FIG. 3 shows an embodiment in which the piezoelectric element is in electricl contact with two separate conductor lines, FIG. 4 shows a metal clad plastic laminate with a hole therein adapted to receive the piezoelectric element, and FIG. 5 shows a piezoelectric element clamped at each end between two metal clad plastic laminate boards.

FIGS. 1 to 5 are not to scale and the dimensions of the components are enlarged considerably for the sake of clarity.

With reference to FIG. 1 there is illustrated a printed wiring board in the form of a metal clad plastics laminate 1 on the upper suface 2 of which a printed circuit 3 has been formed by conventional etching techniques. The circuit 3 has a copper-track 4 bonded to a phenol formaldehyde resin impregnated paper base laminate for receiving one or more piezoelectric elements according to the invention. Other metal clad laminates such as copper clad epoxy resin glass fibre laminates are equally suitable providing their piercing strength does not exceed the compressive strength of the piezoelectric element.

In FIG. 2 a parallel sided piezoelectric "multimorph" element 5 is shown which is coated externally with two thin layers of silver 6, 6'. The piezoelectric element 5 is staked through the copper track 4 of the laminate 1 so that the thin layers 6, 6' contact the separated parts of the copper track at 7 and 8.

The piezoelectric element 5 has been forced through the laminate 1 at a point wholly over the copper track 4 and over a part of the surface of the laminate 1 not covered by the copper track 4. No holes were drilled into the laminate 1 or into the copper track 4 and the piezoelectric element 5 has drawn some of the copper track 4 into the hole on forcing the element 5 through the track 4 and laminate 1. The piezoelectric element 5 is firmly held in electrical contact in a cantilever manner by a combination of the laminate 1 and copper track 4. It is understood that the piezoelectric element 5 may have the end which penetrates the laminate 1 tapered or otherwise shaped in order to assist the initial penetration of the copper track 4 and/or the laminate 1.

FIG. 3 shows two separate conductor lines 3, 4 formed on the surface 2 of a metal clad plastic laminate 1. The end face of a piezoelectric element 5 is shown in contact with the conductor lines at 6 and 6'.

FIG. 4 shows a printed wiring board 1 provided with a hole 9 in registration with the conductor line 4 and adapted to receive a piezoelectric element (not shown) with a force fit. That is to say the area of the hole 9 is smaller than the cross-sectional area of the piezoelectric element to be inserted therein.

FIG. 5 illustrates a piezoelectric element 5 mounted at each end to metal clad plastic laminate boards 1 and 1'. The boards 1 and 1' have metal tracks 4 and 4', respectively, bonded to the facing surfaces thereof.

I claim:

1. A method of mounting an elongate piezoelectric element having two electrodes on a printed wiring board to produce a strong mechanical joint and a good electrical contact to its electrodes which comprises, applying a force to the element with the element held at an angle substantially normal to the surface of the board so that the end of the element penetrates the board and one or more conductor lines at a point on or adjacent to a conductor line of the printed wiring board thereby to make two rigidly fixed separate electrical contacts between the two electrodes and said conductor line or lines.

2. A method according to claim 1 in which the printed wiring board is a printed circuit on a laminated plastics board having a substantially continuous surface.

3. A method according to claim 1 comprising the further step of providing the printed wiring board with holes on or adjacent to the conductor lines into which holes piezoelectric elements of slightly larger cross-sectional area are forced to enlarge the holes and thereby to make electrode contact with at least one conductor line.

4. A method according to claim 3 in which a piezoelectric element is force fitted into a hole adjacent to two conductor lines so as to make electrical contact with both lines and the cross-sectional area of the end of the piezoelectric element that first enters the hole is greater than the cross-sectional area of the hole.

5. A method according to claim 1 in which the piezoelectric element is force inserted through the printed wiring board to just protrude from the other side of the board.

6. A method according to claim 1 in which the force required to rupture the printed wiring board on or adjacent to at least one conductor line is less than 600 MN per meter squared.

7. A method according to claim 2 in which the metal clad plastics laminate is a copper clad phenol-formaldehyde impregnated paper based laminate.

8. A method according to claim 1 in which the piezoelectric element is mounted on the board by being forced through the board substantially the whole length of the element to form a cantilever type mounting.

9. A method according to claim 1 in which the piezoelectric element is rigidly clamped at each end by force inserting each end through a printed wiring board.

10. A method according to claim 1 in which the piezoelectric element is a ferro electric ceramic material of a bilaminar construction and which is polarized orthogonal to the direction of the main axis of the element.

11. An electronic circuit board comprising a printed wiring board including a plate having a substantially continuous surface and made of insulating material, one or more thin flat electric conductor lines on a surface of said board, an elongate piezoelectric element having first and second discrete electrodes on one or more lateral surfaces thereof and mounted on said board at an angle normal to the board surface by forcing one end of the piezoelectric element into said board so as to penetrate through the board at right angles thereto and at a point on or adjacent to a conductor line thereby to produce a strong mechanical joint and a good electric contact between at least one of said electrodes and said conductor line.

12. An electronic circuit board as claimed in claim 11 further comprising one or more holes extending through said printed wiring board in registration with or adjacent to one or more of said conductor lines for receiving one or more piezoelectric elements inserted therein, said piezoelectric element having a larger cross-sectional area than the hole into which it is inserted whereby at least one electrode on a piezoelectric element makes forced contact with at least one conductor line.

13. An electronic circuit board as claimed in claim 11 further comprising a hole in said board adjacent to two conductor lines for receiving a piezoelectric element, said piezoelectric element having a larger cross-sectional area than said hole whereby the piezoelectric element is force fitted into said hole so that said first and second electrodes make electric contact with respective ones of said two conductor lines.

14. An electronic circuit board as claimed in claim 11 wherein said piezoelectric element is mounted on the board by being force inserted through the board, from the conductor line side, to almost the whole of its length thereby to form a cantilever mounting.

15. An electronic circuit board as claimed in claim 11 wherein said piezoelectric element is composed of a ferroelectric ceramic material of a bilaminar construction and which is polarized orthogonal to the main axis of the element and said plate comprises a phenol formaldehyde impregnated paper based laminate.

* * * * *